(12) United States Patent
Lee et al.

(10) Patent No.: US 7,939,872 B2
(45) Date of Patent: May 10, 2011

(54) MULTI-DIELECTRIC FILMS FOR SEMICONDUCTOR DEVICES AND METHODS OF FABRICATING MULTI-DIELECTRIC FILMS

(75) Inventors: Jong-Cheol Lee, Seoul (KR); Sang-Yeol Kang, Gyeonggi-do (KR); Ki-Vin Lim, Gyeonggi-do (KR); Hoon-Sang Choi, Seoul (KR); Eun-Ae Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 117 days.

(21) Appl. No.: 12/079,757

(22) Filed: Mar. 28, 2008

(65) Prior Publication Data

US 2008/0258271 A1 Oct. 23, 2008

(30) Foreign Application Priority Data

Apr. 17, 2007 (KR) .................. 10-2007-0037583

(51) Int. Cl.
*H01L 29/51* (2006.01)

(52) U.S. Cl. ........ 257/296; 257/297; 257/298; 257/299; 257/300; 257/301; 257/302; 257/303; 257/310; 257/E27.016; 257/E27.024; 257/E27.034; 257/E27.048; 257/E27.092; 257/E21.008; 257/E21.009; 257/E21.01; 257/E21.021; 438/239; 438/240; 438/250; 438/253; 438/386; 438/387

(58) Field of Classification Search .......... 257/296–303, 257/310, E27.016, E27.024, E27.034, E27.048, 257/E27.092, E21.008, E21.009, E21.01, 257/E21.021; 438/239, 240, 243, 250, 253, 438/386, 387

See application file for complete search history.

(56) References Cited

U.S. PATENT DOCUMENTS

| | | | | |
|---|---|---|---|---|
| 2004/0072401 A1* | 4/2004 | Iizuka et al. | ................. | 438/240 |
| 2004/0248361 A1* | 12/2004 | Oh et al. | ...................... | 438/240 |
| 2006/0102983 A1* | 5/2006 | Iijima | .......................... | 257/532 |
| 2006/0141695 A1* | 6/2006 | Choi et al. | .................... | 438/232 |
| 2007/0045693 A1* | 3/2007 | Manning et al. | ............. | 257/296 |
| 2007/0102742 A1* | 5/2007 | Kil et al. | ...................... | 257/295 |

FOREIGN PATENT DOCUMENTS

| | | | |
|---|---|---|---|
| JP | 2004-134579 | | 4/2004 |
| KR | 1020060033500 | * | 4/2006 |
| KR | 1020060113249 | | 11/2006 |

* cited by examiner

*Primary Examiner* — Benjamin P Sandvik
*Assistant Examiner* — Farid Khan
(74) *Attorney, Agent, or Firm* — Myers Bigel Sibley & Sajovec

(57) ABSTRACT

A multi-dielectric film including at least one first dielectric film that is a composite film made of zirconium-hafnium-oxide and at least one second dielectric film that is a metal oxide film made of amorphous metal oxide. Adjacent ones of the dielectric films are made of different materials.

21 Claims, 21 Drawing Sheets

MULTI-DIELECTRIC FILMS FOR SEMICONDUCTOR DEVICES AND METHODS OF FABRICATING MULTI-DIELECTRIC FILMS

CROSS REFERENCE TO RELATED APPLICATION

This application is related to and claims priority under 35 USC §119 to Korean Patent Application No. 10-2007-0037583 filed on Apr. 17, 2007 in the Korean Intellectual Property Office, the disclosure of which is incorporated herein by reference in its entirety.

BACKGROUND OF THE INVENTION

The present invention relates to multi-dielectric films for semiconductor devices and methods of fabricating the multi-dielectric film, and more particularly, to multi-dielectric films with a high dielectric constant (k).

As semiconductor devices become more highly integrated and have a higher capacity, thin films with a high dielectric constant (k) have been used as, for example, gate insulating films of transistors, dielectric films of capacitors and/or gate dielectric films of non-volatile memory devices. When such high-k thin films are used, leakage current generated in the thin films can generally be limited where a thin equivalent oxide thickness is maintained.

Metal oxide may be used for a high-k thin film. For example, an aluminum oxide film ($Al_2O_3$), a hafnium oxide film ($HfO_2$) and a zirconium oxide film ($ZrO_2$) have been evaluated for such applications.

As the hafnium oxide film is generally easily crystallized at high temperature, leakage current may be increased. In addition, the hafnium oxide film generally cannot be used for a thin film that requires a high dielectric constant of more than approximately 20. The zirconium oxide film has a high dielectric constant of approximately 35. However, as its crystalline structure is not elaborate, zirconium oxide generally has poor surface morphology, which, in turn, may increase leakage current.

In order to enhance the reliability of the zirconium oxide film, a multi-dielectric film, which includes the zirconium oxide film and an aluminum oxide film, has been proposed. However, when the aluminum oxide film is formed on the zirconium oxide film, because of the crystalline structure of the zirconium oxide, the zirconium oxide film may not be sufficiently crystallized. Even if the zirconium oxide film is crystallized, oxygen required to form the aluminum oxide film may pass through the zirconium oxide film due to large-sized crystal particles. As a result, oxygen that passed through the zirconium oxide film may oxidize an underlying structure of the zirconium oxide film. As a result, leakage current may be increased.

SUMMARY OF THE INVENTION

Embodiments of the present invention provide a multi-dielectric film including at least one first dielectric film that is a composite film made of zirconium-hafnium-oxide and at least one second dielectric film that is a metal oxide film made of amorphous metal oxide. Adjacent ones of the dielectric films are made of different materials.

In other embodiments, the first dielectric film is two dielectric films and one of the second dielectric films is positioned between the two first dielectric films. The amorphous metal oxide film may be $Al_2O_3$, $La_2O_3$, $LaAlO_3$ and/or $YAlO_3$.

In further embodiments, a semiconductor device includes a semiconductor substrate and a lower electrode on the semiconductor substrate. A multi-dielectric film is on the lower electrode and includes at least two dielectric films. An upper electrode is on the multi-dielectric film. Each of the at least two dielectric films is either a composite film made of zirconium-hafnium-oxide or a metal oxide film made of amorphous metal oxide. Adjacent ones of the dielectric films are made of different materials. The lower electrode may have a cylinder structure. A lower electrode supporting pattern may be connected to an end of an upper part of the lower electrode.

In other embodiments, the at least two dielectric films are three dielectric films. A first dielectric film is the composite film, a second dielectric film is on the first dielectric film. The second dielectric film is the metal oxide film. A third dielectric film is on the second dielectric film The third dielectric film is the composite film. The lower electrode may directly contact one of the dielectric films that is the composite film. The metal oxide film may be $Al_2O_3$, $La_2O_3$, $LaAlO_3$ and/r $YAlO_3$.

In yet further embodiments of the present invention, methods of fabricating a multi-dielectric film include forming at least one composite dielectric film that is a composite film made of zirconium-hafnium-oxide. At least one metal oxide dielectric film is formed that is a metal oxide film made of amorphous metal oxide. Adjacent ones of the dielectric films are made of different materials. Forming the at least one composite dielectric film and forming the at least one metal oxide dielectric film may include forming a first dielectric film comprising the composite film, forming a second dielectric film on the first dielectric film, the second dielectric film comprising the metal oxide film and forming a third dielectric film comprising the composite film on the second dielectric film. Forming at least one composite dielectric film may include reacting a compound of a zirconium precursor and a hafnium precursor with an oxidizer.

In other embodiments, forming at least one composite dielectric film includes repeatedly forming zirconium oxide and forming hafnium oxide on the zirconium oxide and heat-treating the formed zirconium oxide and hafnium oxide. Forming the at least one composite dielectric film and forming the at least one metal oxide dielectric film may be preceded by forming a lower electrode on a semiconductor substrate and the at least one composite dielectric film and the at least one metal oxide dielectric film: may be formed on the lower electrode. The method may further include forming an upper electrode on the multi-dielectric film.

In further embodiments, forming the at least one composite dielectric film and forming the at least one metal oxide dielectric film includes forming a first dielectric film, which comprises the composite film, on the lower electrode, forming a second dielectric film, which comprises the metal oxide film, on the first dielectric film and forming a third dielectric film, which comprises the composite film, on the second dielectric film. Forming the at least one composite dielectric film and forming the at least one metal oxide dielectric film includes forming one of the composite dielectric films directly on a top surface of the lower electrode. Forming at least one composite dielectric film may include reacting a compound of a zirconium precursor and a hafnium precursor with an oxidizer.

In yet other embodiments, forming at least one composite dielectric film includes repeatedly forming a zirconium oxide and forming hafnium oxide on the zirconium oxide. The formed zirconium oxide and the hafnium oxide may be heat treated. The metal oxide film may be $Al_2O_3$, $La_2O_3$, $LaAlO_3$ and/or $YAlO_3$. The lower electrode may have a cylinder structure. Forming the lower electrode may include forming a lower electrode supporting pattern connected to an end of an upper part of the lower electrode.

In further embodiments, forming the lower electrode includes forming an inter-layer insulating film including a contact plug extending therethrough on the semiconductor substrate. A mold, which exposes a top surface of the contact plug, is formed on the inter-layer insulating film. The lower electrode is conformally formed on the mold and the mold is removed to define the lower electrode. Forming the mold may include stacking an etch-stop film, an insulating film for a mold, and a lower electrode supporting film on the inter-layer insulating film and removing the etch-stop film, the insulating film for the mold, and a portion of the lower electrode supporting film to define the mold which exposes the top surface of the contact plug. Conformally forming the lower electrode on the mold may be followed by forming a lower electrode supporting film pattern connected to an end of the lower electrode by patterning the lower electrode supporting film.

BRIEF DESCRIPTION OF THE DRAWINGS

The above and other features and advantages of the present invention will become readily apparent along with the following detailed description when considered in conjunction with the accompanying drawings wherein.

DETAILED DESCRIPTION OF EMBODIMENTS OF THE INVENTION

Figure 1:
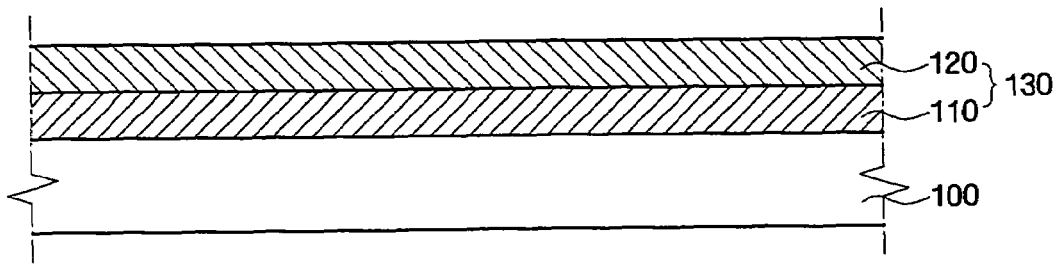
FIG. 1 is a cross-sectional view of a multi-dielectric film according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A multi-dielectric film and a method of fabricating the same according to a first embodiment of the present invention will now be described with reference to FIGS. 1, 2A and 2B, 3A through 3D, and 4A through 4C.

A multi-dielectric film 130 according to some embodiments of the present invention will now be described with reference to the cross-sectional view of FIG. 1. As seen in FIG. 1, the multi-dielectric film 130 has a stacked structure including a composite film 110 and a metal oxide film 120. For the embodiments of FIG. 1, the composite film 110 is zirconium-hafnium-oxide and the metal oxide film 120 is amorphous metal oxide.

The zirconium-hafnium-oxide composite film 110, having two metal components, has a high dielectric constant due to a zirconium oxide component and a relatively elaborate (complex) crystalline structure due to a hafnium oxide component. As a result, the composite film 110 may have a good surface morphology. In addition, the composite film 110 does not have a layered structure, which may reduce partial defects.

The metal oxide film 120 is disposed on the composite film 110. The metal oxide film 120 is made of amorphous metal oxide having superior leakage current characteristics. The amorphous metal oxide remains amorphous, even at high temperature, which may limit or even prevent deterioration of reliability of the composite film 110 when the composite film 110 has partial and minor defects. The amorphous metal oxide, as it does not have crystal grain boundaries, may have superior leakage current characteristics. The amorphous metal oxide may be $Al_2O_3$, $La_2O_3$, $LaAlO_3$ and/or $YAlO_3$. As described above, as the multi-dielectric film 130 has a stacked structure of the composite film 110 made of zirconium-hafnium-oxide and the metal oxide film 120 made of amorphous metal oxide, such as $Al_2O_3$, $La_2O_3$ or it can reduce partial defects and have a high dielectric constant. Consequently, the reliability of the multi-dielectric film 130 may be enhanced.

Figure 2A:
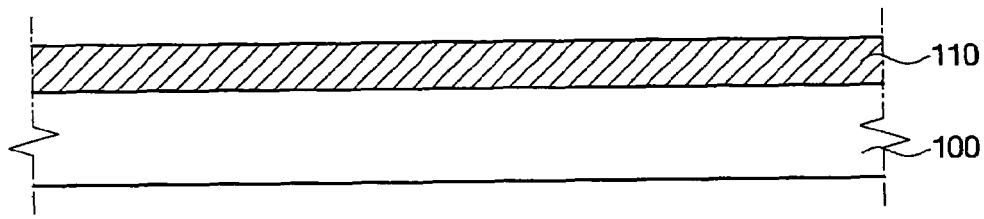
FIGS. 2A and 2B are cross-sectional views sequentially illustrating a method of forming a multi-dielectric film according to some first embodiments of the present invention.
Figure 2B:
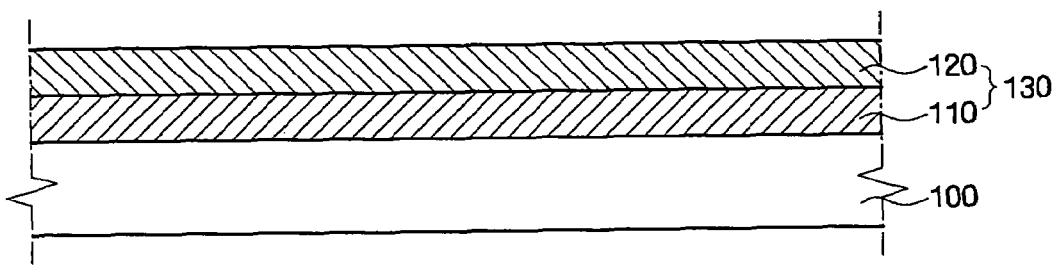
Figure 3A:
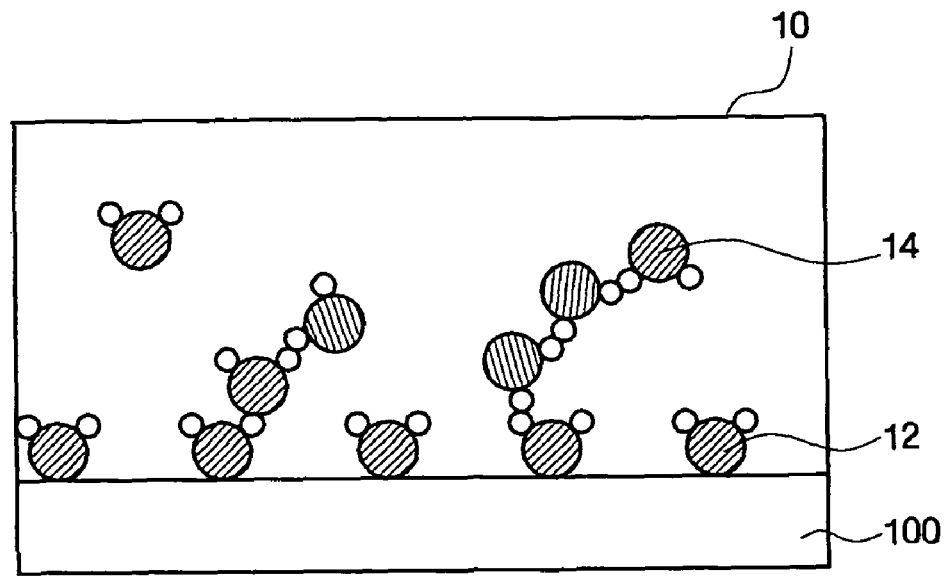
FIGS. 3A through 3D are cross-sectional views sequentially illustrating a method of forming the composite film included in the multi-dielectric film of FIGS. 2A-2B according to some embodiments of the present invention.
Figure 3B:
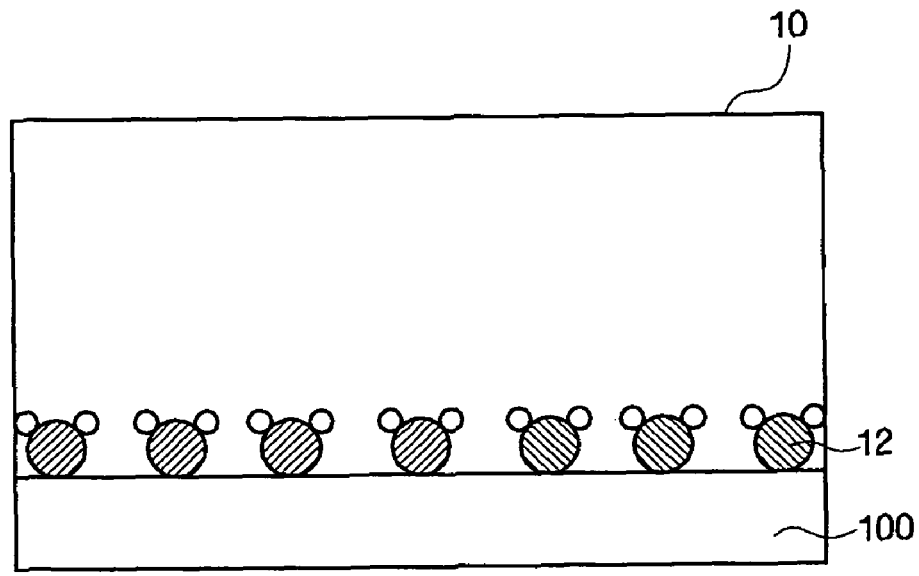

A method of forming a multi-dielectric film according to some embodiments of the present invention will be described. FIGS. 2A and 2B are cross-sectional views sequentially illustrating a method of forming the multi-dielectric film 130 according to some embodiments of the present invention. FIGS. 3A through 3D are cross-sectional views sequentially illustrating a method of forming a composite film 110 included in the multi-dielectric film of FIGS. 2A and 2B. FIGS. 4A through 4C are cross-sectional views sequentially illustrating another method of forming the composite film 110 included in the multi-dielectric film of FIGS. 2A and 2B.

Referring to FIG. 2A, the zirconium-hafnium-oxide composite film 110 is formed on a semiconductor substrate 100. Zirconium-hafnium-oxide may be designated as $Zr_xHf_{1-x}O$, where x has a value smaller than 1. The zirconium-hafnium-oxide of the composite film 110 may have a crystalline and/or amorphous phase.

The method of forming the composite film 110 will be described in more detail with reference to FIGS. 3A through 3D. Referring to FIG. 3A, a semiconductor substrate 100 is placed in a chamber 10 under predetermined temperature and pressure conditions. For example, the inside of the chamber 10 may be maintained at a temperature of approximately 200° C. to 500° C. and a pressure of approximately 0.1 to 3.0 torr. A compound of a hafnium precursor material and a zirconium precursor material is supplied to the chamber 10.

The zirconium precursor material may be, for example, tetrakis ethyl methyl amino zirconium (TEMAZ), tetrakis di-methyl amino zirconium (TDMAZ), tetrakis di-ethyl amino zirconium (TDEAZ), $Zr(O^tBu)_4$ and/or $ZrCl_4$. In addition, the hafnium precursor material may be, for example, tetrakis ethyl methyl amino hafnium (TEMAH), tetrakis di-methyl amino hafnium (TDMAH), tetrakis di-ethyl amino hafnium (TDEAH), $Hf(O^tBu)_4$ and/or $HfCl_4$.

The compound of the zirconium precursor material and the hafnium precursor material may be stored within a canister in a liquid state. In some embodiments, gas may be supplied to the canister and the compound in a gas state may be supplied to the chamber 10.

First portions 12 of the compound supplied into the chamber 10 are chemically adhered onto the semiconductor substrate 100, and remaining second portions 14 of the compound are physically adhered to the first portions 12 and/or float in the chamber 10.

A purge gas, such as $N_2$, He or Ar, may be supplied into the chamber 10 to remove the compound remaining floating within the chamber 10 and the physically adhered second portions 14 of the compound. The physically adhered second portions 14 of the compound in the chamber 10 can be removed using not only the above method, but also other methods. Accordingly, as illustrated in FIG. 3B, only the chemically adhered first portions 12 of the compound may remain on the semiconductor substrate 100 within the chamber 10.

Figure 3C:
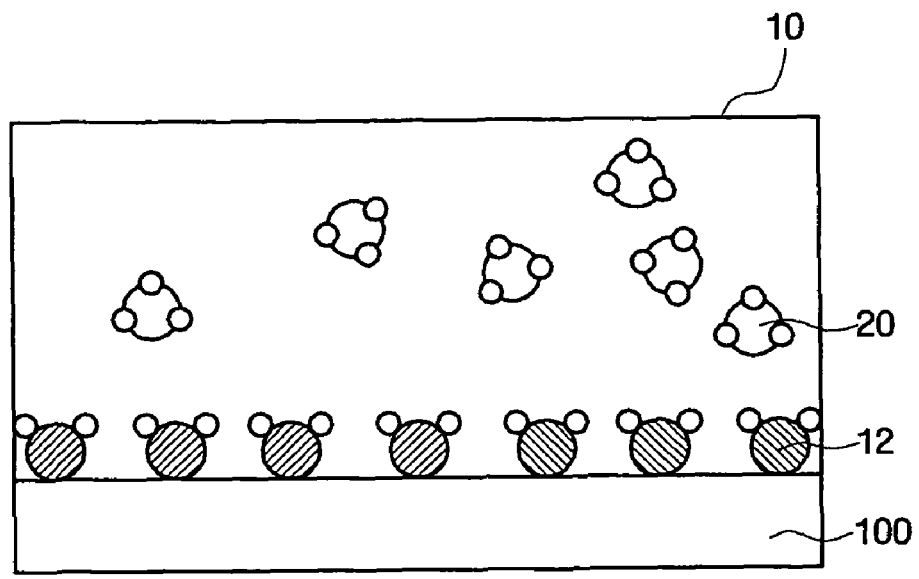
Figure 3D:
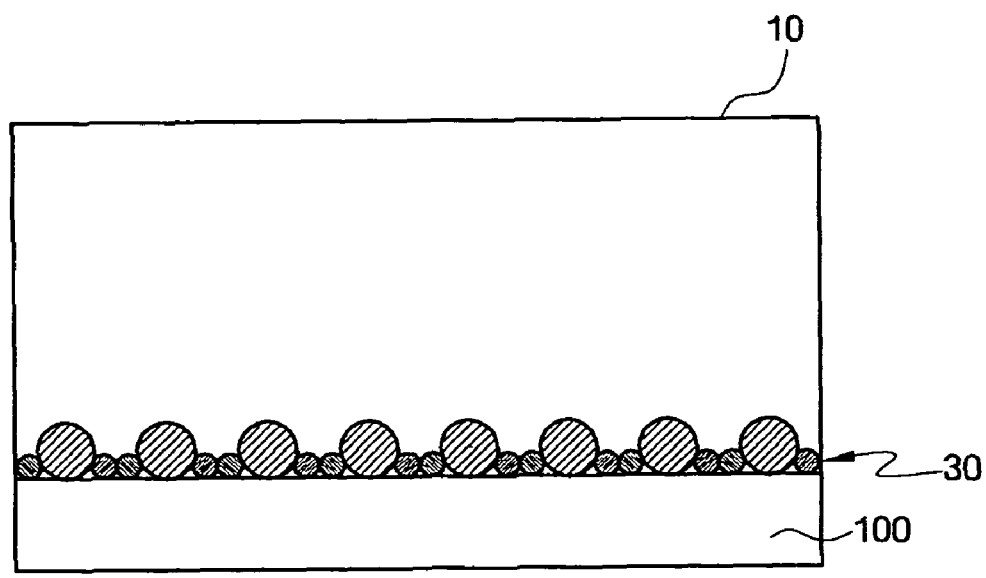
Figure 4A:
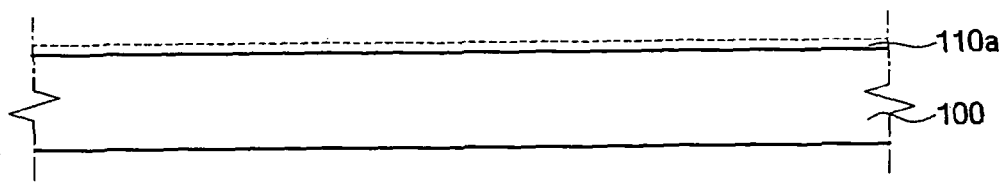
FIGS. 4A through 4C are cross-sectional views sequentially illustrating a method of forming the composite film included in the multi-dielectric film of FIGS. 2A-2B according to some embodiments of the present invention.
Figure 4B:
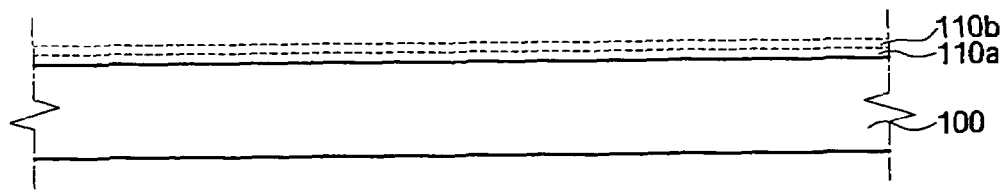
Figure 4C:
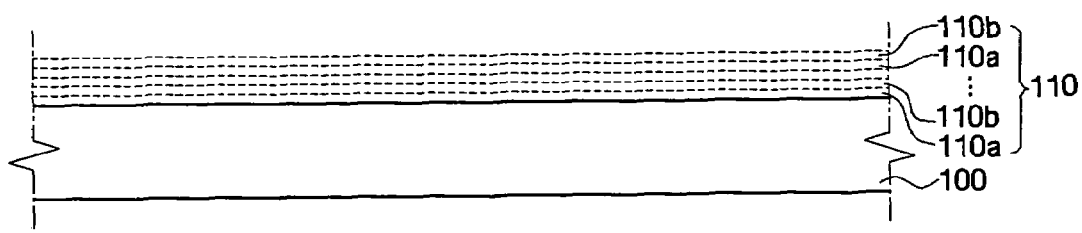

Referring to FIG. 3C, an oxidizer 20 is supplied into the chamber 10 in which the first portions 12 of the compound remain on the semiconductor substrate 100. The oxidizer 20 may be, for example, $O_2$, $O_3$, $H_2O$, plasma $O_2$ and/or remote plasma $O_2$. As the oxidizer 20 is supplied into the chamber 10, the first portions 12 adhered onto the semiconductor substrate 100 are oxidized.

A purge gas is supplied into the chamber 10 to remove the oxidizer 20 remaining within the chamber 10 and un-oxidized ones of the first portions 12. Accordingly, referring to FIG. 3D, zirconium-hafnium-oxide 30 may be formed on the semiconductor substrate 100 within the chamber 10.

If the above processes are repeated, the zirconium-hafnium-oxide 30 may be continuously stacked on the semiconductor substrate 100. Consequently, the composite film 110 as illustrated in FIG. 1 may be formed. The thickness of the composite film 110 may be controlled by the number of times that the processes illustrated in FIGS. 3A through 3D are repeated.

Referring to FIG. 2A, after the zirconium-hafnium-oxide composite film 110 is formed, it may be heat-treated. This heat treatment process can enhance surface morphology of the zirconium-hafnium-oxide and reduce partial defects of the composite film 110. The heat treatment process may be performed at a temperature of about 300° C. to about 700° C.

The composite film 110 may also be formed using the method illustrated in FIGS. 4A through 4D. Referring to FIG. 4A, a first thin film 110a made of zirconium oxide ($ZrO_2$) is formed on a semiconductor substrate 100. In particular, a zirconium precursor material may be supplied into a chamber in which the semiconductor substrate 100 is placed. The zirconium precursor material may be, for example, tetrakis ethyl methyl amino zirconium (TEMAZ), tetrakis di-methyl amino zirconium (TDMAZ), tetrakis di-ethyl amino zirconium (TDEAZ), $Zr(O^tBu)_4$ and/or $ZrCl_4$.

A portion of the zirconium precursor material supplied into the chamber is chemically adhered to the semiconductor substrate 100, and the remaining portion of the zirconium precursor material, which is not chemically adhered, is either physically adhered or floats within the chamber. The portion of the zirconium precursor material which was not chemically adhered to the semiconductor substrate 100 may be removed by supplying a purge gas into the chamber. An inert gas, such as $N_2$, He or Ar, may be used as the purge gas.

After purging, an oxidizer may be supplied into the chamber to oxide the chemically adhered portion of the zirconium precursor material. As a result, zirconium oxide ($ZrO_2$) may be formed on a surface of the semiconductor substrate 100. The remaining oxidizer and residues may be removed by supplying the purge gas into the chamber. The first thin film 110a made of zirconium oxide is formed on the semiconductor substrate 100 by repeating the above processes more than once.

Referring to FIG. 4B, a second thin film 110b made of hafnium oxide ($HfO_2$) is formed on the first thin film 110a. In particular, the semiconductor substrate 100 having the first thin film 110a formed thereon may be placed in the chamber and a hafnium precursor material may be supplied into the chamber. The hafnium precursor material may be, for example, tetrakis ethyl methyl amino hafnium (TEMAH), tetrakis di-methyl amino hafnium (TDMAH), tetrakis di-ethyl amino hafnium (TDEAH), $Hf(O^tBu)_4$ and/or $HfCl_4$.

A portion of the hafnium precursor material supplied into the chamber is chemically adhered to the first thin film 110a and the remaining portion of the hafnium precursor material, which is not chemically adhered, is either physically adhered or floats within the chamber. The physically adhered portion of the hafnium precursor material may be removed by purging the inside of the chamber.

Next, an oxidizer is supplied into the chamber to oxide the chemically adhered portion of the zirconium precursor material. As a result, hafnium oxide ($HfO_2$) may be formed on the surface of the semiconductor substrate 100. The remaining oxidizer and residues may be removed by supplying the purge gas into the chamber. The second thin film 110b made of hafnium oxide may be formed on the first thin film 110a by repeating the above processes more than once.

Thee process of forming the first thin film 110a and the process of forming the second thin film 110b may be repeated in an alternating fashion to form the composite film 110 having the first and second thin films 110a and 110b alternately stacked as illustrated in FIG. 4C. That is, zirconium oxide and hafnium oxide, each having an atomic-layer thickness, may be repeatedly stacked to produce zirconium-hafnium-oxide. As each of the first and second thin films 110a and 110b can be formed to a very thin atomic level thickness, zirconium-hafnium-oxide may be formed on the semiconductor substrate 100 as a thin film that is composed of zirconium oxide mixed with hafnium oxide.

After the zirconium-hafnium-oxide is formed using the above method, the composite film 110 may be heat-treated in order to limit or even prevent the formation of a layered structure, in other words, to provide a more uniform composite film 110.

The composite film 110 formed as described above can have a high dielectric constant due to the included zirconium oxide. In addition, as the crystalline of the composite film 110 becomes more complex due to the included hafnium oxide, the composite film 110 can have good surface morphology. Also, the composite film 110 may be provided without a layered structure, which may reduce partial defects.

Referring again to FIG. 2B, after the zirconium-hafnium-oxide composite film 110 is formed on the semiconductor substrate 100, the amorphous metal oxide film 120, such as aluminum oxide, $La_2O_3$ is formed on the composite film 110.

The method of forming the metal oxide film 120 will now be described in more detail. For explanatory purposes, this description assumes aluminum oxide is to be used to form the metal oxide film 120. First, an aluminum precursor material is supplied into a chamber in which the semiconductor substrate 100 having the composite film 110 formed thereon is placed. The aluminum precursor material may be, for example, trimethyl aluminum (TMA): $Al(CH_3)_3$, $AlCl_3$, $AlH_3N(CH_3)_3$, $C_6H_{15}AlO$, $(C_4H_9)_2AlH$, $(CH_3)_2AlCl$, $(C_2H_5)_3Al$ and/or $(C_4H_9)_3Al$. A portion of the aluminum precursor material supplied into the chamber is chemically adhered onto a surface of the composite film 110, and the remaining portion of the aluminum precursor material is either physically adhered or floats within the chamber.

Next, the supply of the aluminum precursor material to the chamber is stopped and, for example, a purge gas is supplied to the chamber in order to remove the portion of the aluminum precursor material that was not chemically adhered. An oxidizer may be supplied into the chamber to oxide the chemically adhered portion of the aluminum precursor material. As a result, aluminum oxide ($Al_2O_3$) may be formed on the surface of the composite film 110. The remaining oxidizer and byproducts may be removed by purging the inside of the chamber again.

By repeating the above processes, aluminum oxide may be stacked on the composite film 110 to form the metal oxide film 120 to a predetermined thickness. Thus, the multi-dielectric film 130, which includes the composite film 110 made of zirconium-hafnium-oxide and the metal oxide film 120 made of amorphous aluminum oxide, may be formed on the semiconductor substrate 100.

If the metal oxide film 120 made of amorphous aluminum oxide is formed on the composite film 110 made of zirconium-hafnium-oxide, the metal oxide film 120 without crystal grain boundaries may compensate for partial and minor defects of the composite film 110. Therefore, the reliability of the multi-dielectric film 130 may be enhanced.

$La_2O_3$, $LaAlO_3$ or $YAlO_3$ may also be selected as the material of the metal oxide film 120. That is, the metal oxide film 120 may also be formed of $La_2O_3$, $LaAlO_3$ or $YAlO_3$ using, for example, a method substantially identical to the above method of forming the metal oxide film 120 of aluminum oxide except that the method uses a La precursor or a Y precursor.

According to the method of forming the multi-dielectric film 130 described above, after the composite film 110 made of zirconium-hafnium-oxide is formed, the metal oxide film 120 made of amorphous metal oxide is formed on the composite film 110. However, the order in which the composite film 110 and the metal oxide film 120 are formed may be changed. That is, the metal oxide film 120 may be formed on or under the composite film 110.

Figure 5:
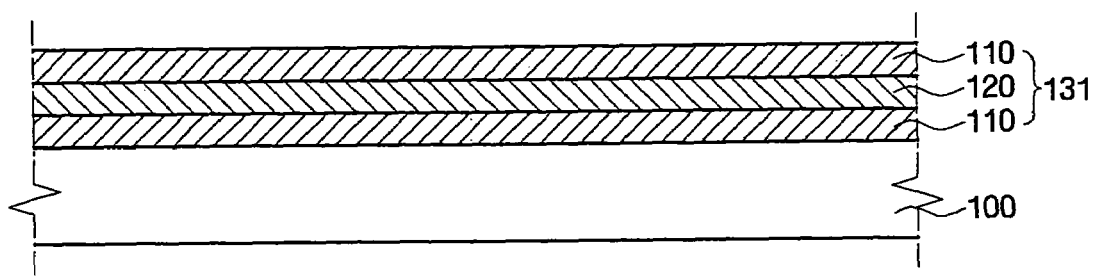
FIG. 5 is a cross-sectional view of a multi-dielectric film according to other embodiments of the present invention.

A multi-dielectric film according to other embodiments of the present invention will be described with reference to the cross-sectional illustration of FIG. 5. Referring to FIG. 5, the multi-dielectric film 131 has a triple-layer structure, in which a composite film 110 and a metal oxide film 120 are stacked. That is, the composite film 110 made of zirconium-hafnium-oxide may be formed on a semiconductor substrate 100, the metal oxide film 120 made of, for example, amorphous aluminum oxide may be formed on the composite film 110, and the composite film 110 made of zirconium-hafnium-oxide may further be formed on the metal oxide film 120. The order in which the metal oxide film 120 and the composite film are formed may be changed. In some embodiments, the order may be changed but contact between a surface of the metal oxide film 120 and a surface of the composite film 110 is maintained by the changed ordering.

A method of forming the multi-dielectric film 131 having the triple-layer structure may be, for example, substantially identical to the method of forming the multi-dielectric film 130 described above in detail with reference to FIGS. 2A to 3D. Hence, the method of forming the multi-dielectric film 131 need not be further described herein.

Figure 6:
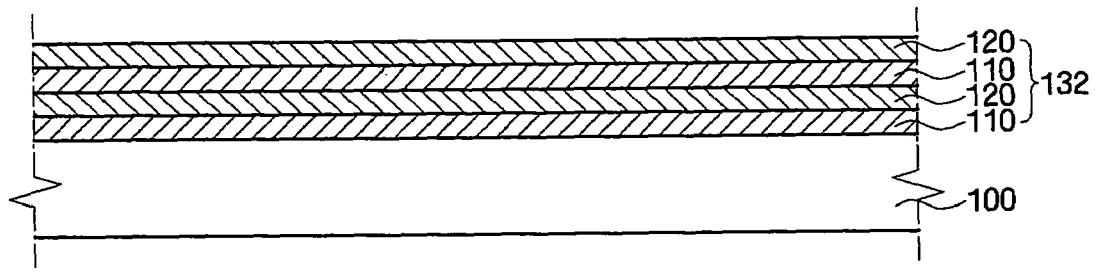
FIG. 6 is a cross-sectional view of a multi-dielectric film according to further embodiments of the present invention.

A multi-dielectric film may also be formed as illustrated in FIG. 6. FIG. 6 is a cross-sectional view of a multi-dielectric film 132 according to further embodiments of the present invention. Referring to FIG. 6, the multi-layer film 132 may be formed to have a laminate structure by alternately stacking a composite film 110 and a metal oxide film 120 on a semiconductor substrate 100. As in the previous embodiments, however, the metal oxide film 120 may be formed on the semiconductor substrate 100, and then the composite film 110 may be formed on the metal oxide film 120 to produce the multi-layer film 132.

As described above, as each of the multi-dielectric films 130 through 132 includes the composite film 110, which is made of zirconium-hafnium-oxide, and the metal oxide film 120, which is made of amorphous metal oxide and contacts the composite film 110, it may have superior reliability.

The multi-dielectric films 130 through 132 according to embodiments of the present invention can be applied in fabricating various semiconductor devices. For example, the multi-dielectric films 130 through 132 can be used as dielectric films of capacitors in volatile memory devices, such as dynamic random access memories (DRAMs) and static random access memories (SRAMs), non-volatile memory devices, such as electrically erasable programmable read-only memories (EEPROMs) and flash memories, logic devices, micro electro mechanical system (MEMS) devices, optoelectronic devices, and display devices. The multi-dielectric films 130 through 132 may be applied regardless of the form of the capacitors. That is, they can be applied not only as dielectric films of capacitors having flat dielectric films formed between conductors, but also applied as dielectric films of three-dimensional (3D) capacitors, such as cylinder-type, pin-type, and stack-type capacitors, which are mere examples.

A method of fabricating a semiconductor device using a multi-dielectric film according to some embodiments of the present invention will now be described with reference to FIGS. 7 through 14. FIGS. 7 through 12 and 14 are cross-sectional views sequentially illustrating a method of fabricating a semiconductor device using a multi-dielectric film according some embodiments of the present invention. FIGS. 13A through 13C are enlarged views of portion A illustrated in FIG. 12.

Figure 7:
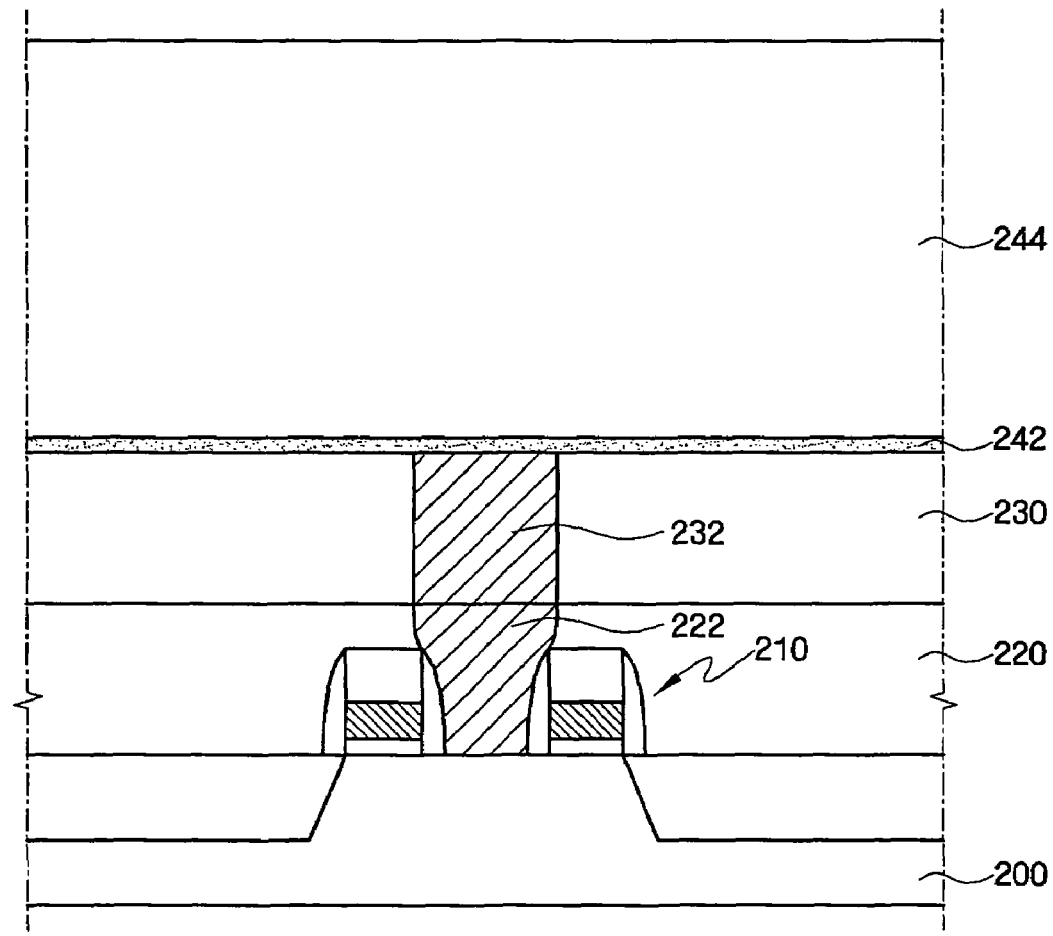
FIGS. 7 through 12 and 14 are cross-sectional views sequentially illustrating a method of fabricating a semiconductor device using a multi-dielectric film according to some embodiments of the present invention.

Referring first to FIG. 7, gate electrodes 210 are formed on a semiconductor substrate 200, which is divided into an active region and a field region. Each of the gate electrodes 210 may have a stacked structure of an insulating film pattern, a conductive film pattern, and a capping film pattern. In addition, spacers are shown formed on both sides of the stacked structure. After the gate electrodes 210 are formed, an ion implantation process may be performed to form impurity regions in the active region between the gate electrodes 210.

A first inter-layer insulating film 220 covering the gate electrodes 210 is formed on the semiconductor substrate 200. The first inter-layer insulating film 220 is etched to form a first contact hole, which exposes the active region between the gate electrodes 210. Next, the first contact hole is filled with a conductive material to form a first contact plug 222 electrically connected to the active region. Specifically, in order to form the first contact plug 222, the conductive material may be deposited in the first contact hole and then planarized until a top surface of the first inter-layer insulating film 220 is exposed.

Next, a bitline is formed on the first inter-layer insulating film 220 that includes the first contact plug 222. A second inter-layer insulating film 230 covering the bitline is formed on the first inter-layer insulating film 220.

After the second inter-layer insulating film 230 is formed, a photolithography process is performed on the second inter-layer film 230 until a top surface of the first contact plug 222 is exposed. As a result, a second contact hole is formed. The second contact hole is filled with a conductive material to form a second contact plug 232 connected to the first contact plug 222.

A lower electrode of a capacitor, which is electrically connected to the second contact plug 232, is formed on the second contact plug 232. The lower electrode of the capacitor may be of various types, such as a planar type or a cylinder type. A method will be described based on the assumption that the lower electrode is of the cylinder type.

After the second contact plug 232 is formed, an etch-stop film 242 and an insulating film 244 for a mold are sequentially formed on planarized top surfaces of the second inter-layer insulating film 230 and the second contact plug 232.

A silicon nitride film (SiN) or a silicon oxy-nitride film (SiON) may be used as the etch-stop film 242, and a silicon oxide film may be used as the insulating film 244 for a mold. The insulating film 244 may be formed by depositing a number of silicon oxide films with different wet etch rates or by repeating the process of depositing a silicon nitride film and a silicon oxide film. The height of the lower electrode, which is to be formed in a subsequent process, may be determined by thicknesses of the etch-stop film 242 and the insulating film 244 formed on the second inter-layer insulating film 230 and the second contract plug 232.

Figure 8:
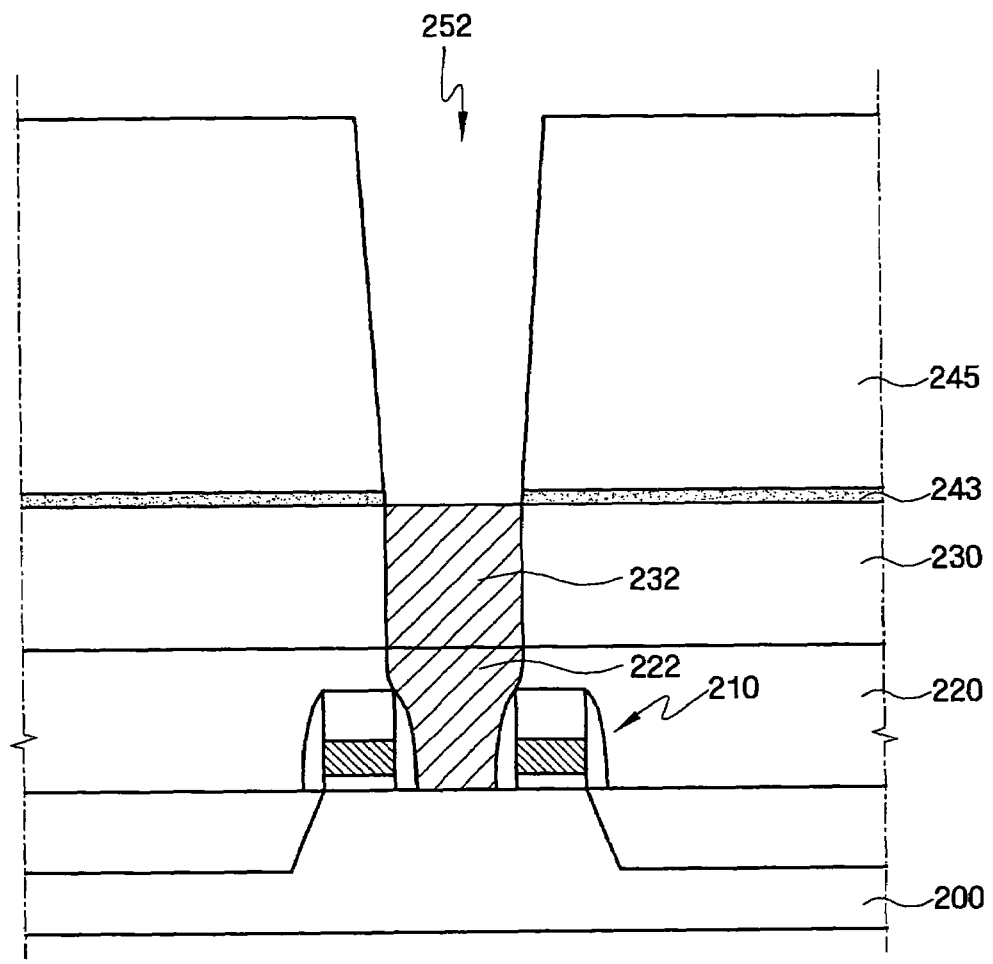

Referring to FIG. 8, an etching mask, such as a photoresist pattern, is formed on the insulating film 244 for a mold in order to produce a hole for forming a lower electrode. Using the etching mask, a portion of the insulating film 244 is etched until the etch-stop film 242 under the insulating film 244 is exposed. As a result, an opening is formed. The etch-stop film 242 may prevent its underlying second inter-layer insulating film 230 from being etched.

The portion of the etch-stop film 242 exposed by the opening is etched and, thus, removed to expose the second contact plug 232 under the etch-stop film 242. Accordingly, a hole 252 for forming a lower electrode is formed in the etch-stop film 242 to define an etch-stop film 243 and in the insulating film 244 to define an insulating film 245 for forming a mold.

Figure 9:
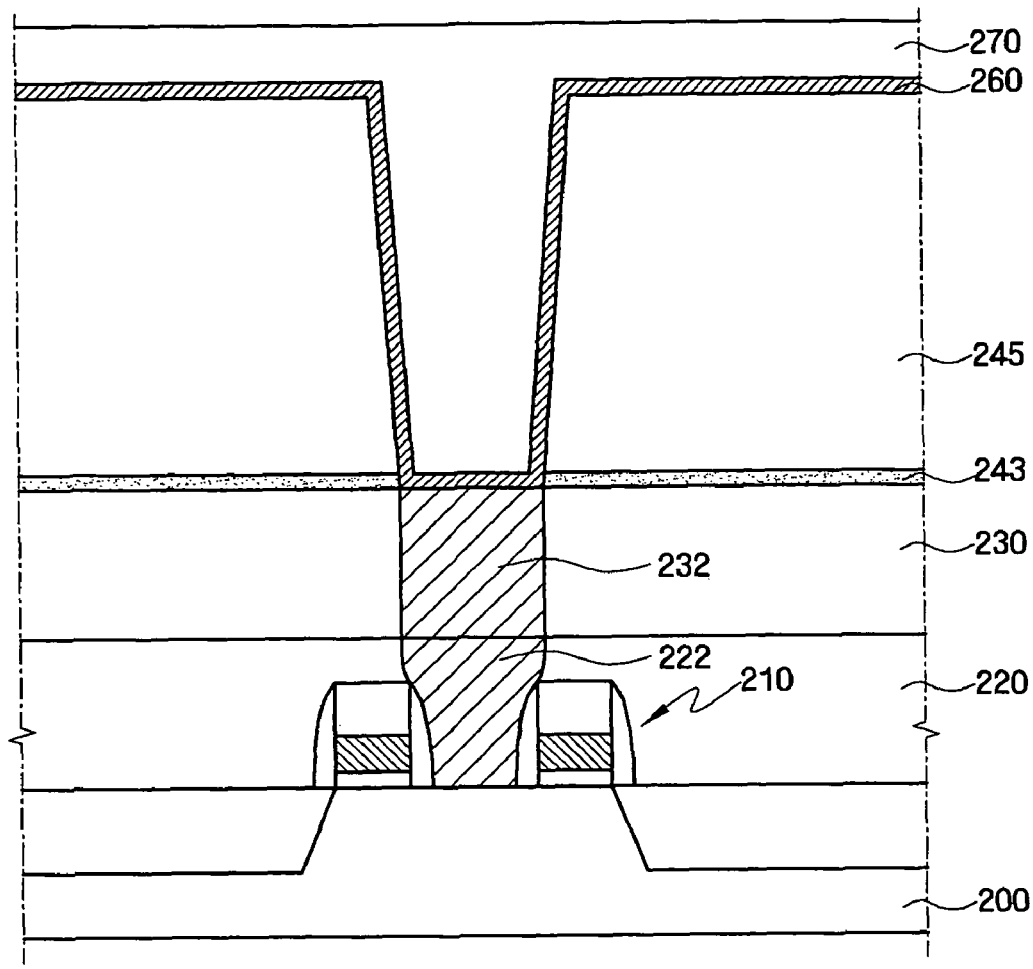
Figure 10:
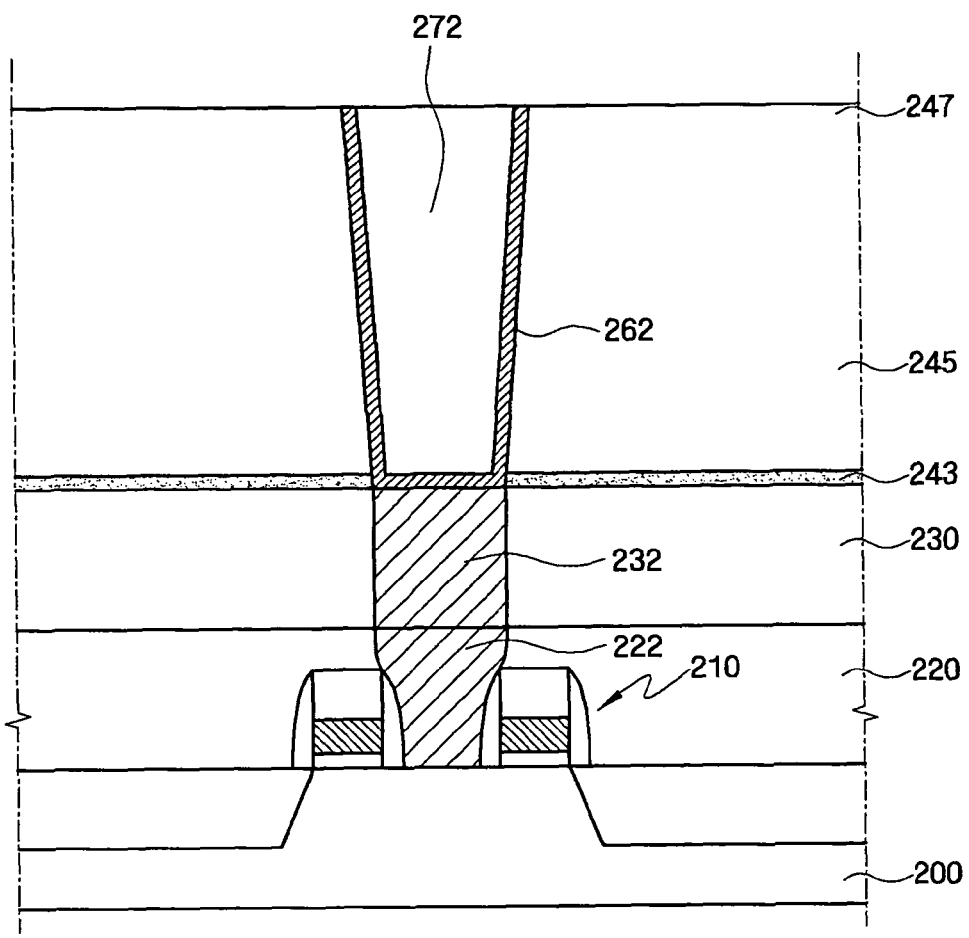

Referring to FIG. 9, a conductive film 260 for a lower electrode may be conformally formed along a surface of the hole 252. The conductive film 260 may be formed of TiN, TiAlN, TaN, W, WN, Ru, RuO$_2$, SrRuO$_3$, Ir, IrO$_2$ and/or Pt. A sacrificial film 270 is formed, which fills the hole 252 having the conductive film 260 formed on the surface thereof. The sacrificial film 270 is formed in order to perform a planarization process for separating a lower electrode. The sacrificial film 270 may be formed of a material that has superior gap-fill characteristics and can be selectively removed due to its higher etching selectivity than a silicon oxide film or a silicon nitride film.

The sacrificial film.270 may be planarized until a top surface of the insulating film 245 for a mold is exposed. The planarization process may be chemical-mechanical polishing process and/or an etch-back process. Accordingly, referring to FIG. 10, the conductive film 260 for a lower electrode is separated to define a lower electrode 262. A portion of the sacrificial film 270 remains to define a sacrificial film 272 remaining on and within the lower electrode 262.

Figure 11:
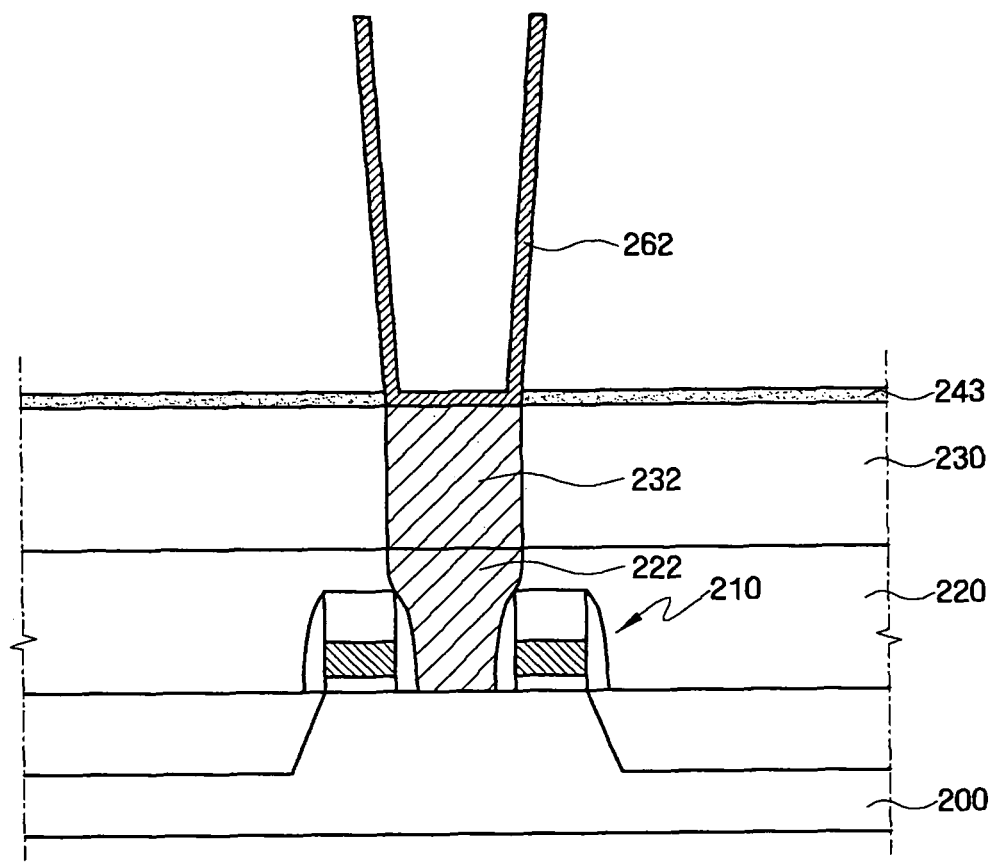

A wet etching process may be performed in order to remove the sacrificial film 272 and the insulating film 245. Consequently, the cylinder-type lower electrode 262 is defined as illustrated in FIG. 11. During the wet-etching process, the etch-stop film 243 may prevent the second inter-layer insulating film 230 from being etched.

Figure 12:
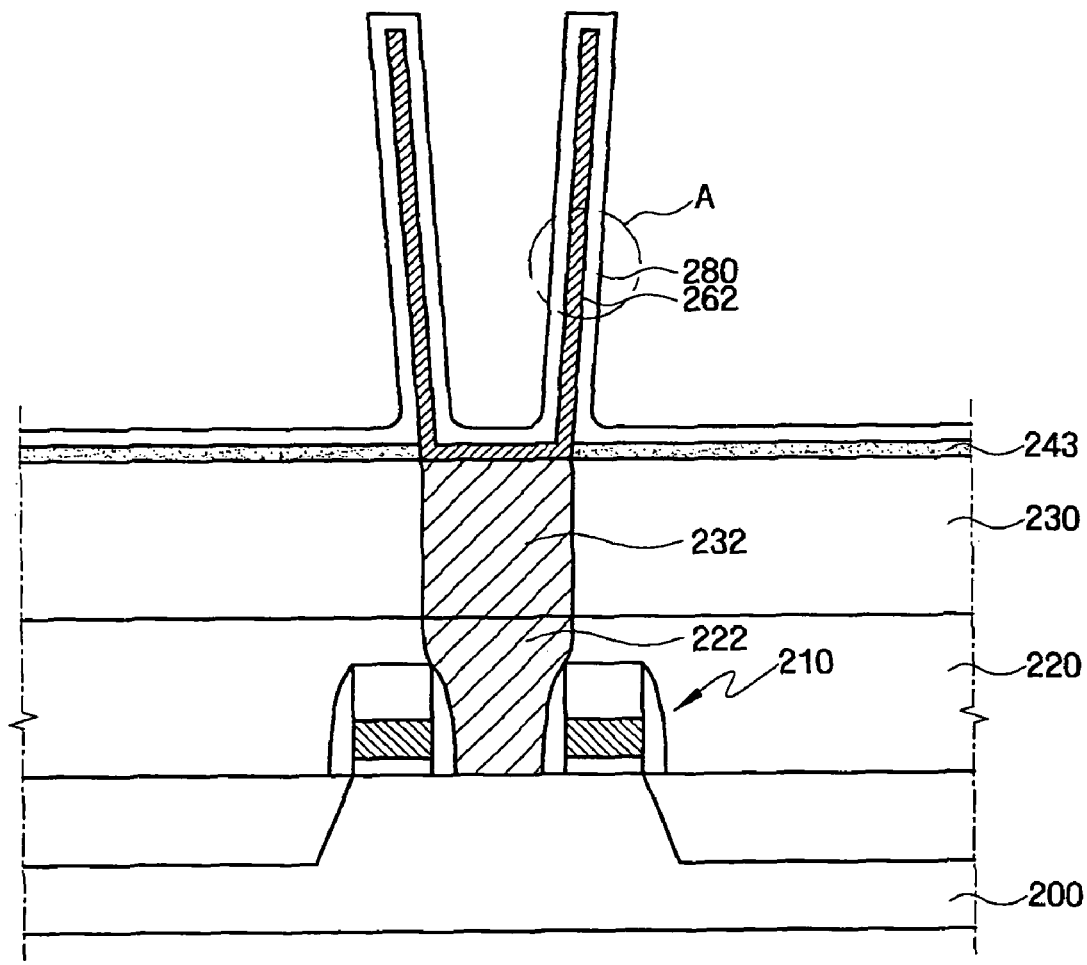
Figure 13A:
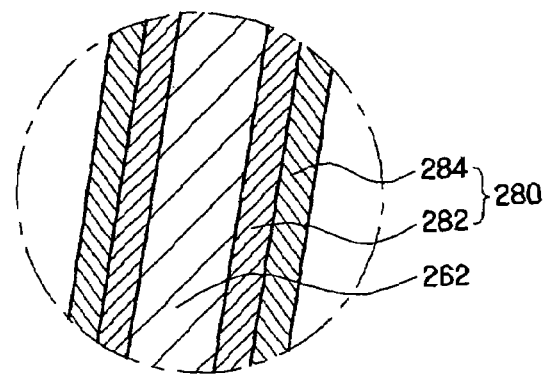
FIGS. 13A through 13C are enlarged views of portion A illustrated in FIG. 12.
Figure 13B:
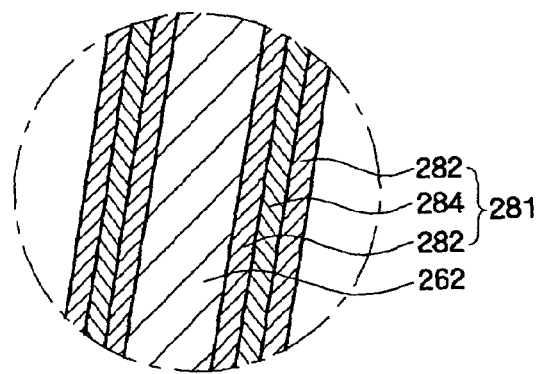
Figure 13C:
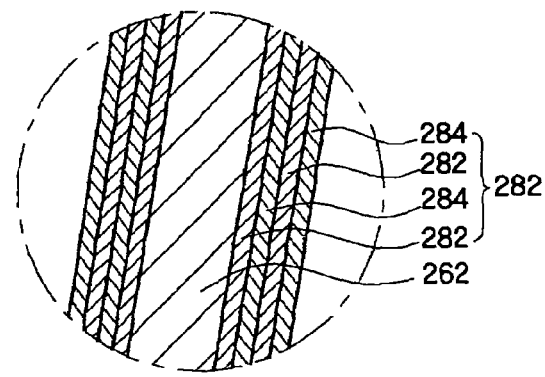

Referring to FIG. 12, a multi-dielectric film 280 may be conformally formed along surfaces of the cylinder-type lower electrode 262 and the etch-stop film 243. More specifically, the multi-dielectric film 280 is shown (FIG. 13) formed of a composite film 282, which is made of zirconium-hafnium-oxide, and a metal oxide film 284 which is made of amorphous metal oxide.

That is, referring to FIG. 13A, the composite film 282 is formed on the lower electrode 262, and the metal oxide film 284 is formed on the composite film 282 to produce the multi-dielectric film 280 having a dual-layer structure.

As described above, the composite film 282, which is made of zirconium-hafnium-oxide having a complex crystalline and a high dielectric constant, is formed, and then the metal oxide film 284, which is made of amorphous metal oxide, is formed on the composite film 282 to produce the multi-dielectric film 280. Therefore, when the metal oxide film 284 is formed, oxygen atoms of an oxidizer can be limited or even prevented from permeating into the composite film 282. That is, the oxidation of the lower electrode 262 may be prevented when the multi-dielectric film 280 is formed. Consequently, leakage current of the semiconductor device may be reduced.

In addition, when the multi-dielectric film 280 including the composite film 282, which is made of zirconium-hafnium-oxide, and the metal oxide film 284, which is made of amorphous metal oxide, is used, the metal oxide film 284 without crystal grain boundaries may compensate for defects of the composite film 282. Therefore, the reliability of the multi-dielectric film 280 may be further enhanced.

Referring to FIG. 13B, the composite film 282 and the metal oxide film 284 may be formed on the lower electrode 262 in a triple-layer structure. Consequently, a multi-dielectric film 281 may be formed. Referring to FIG. 13C, a multi-dielectric film 282 having the composite film 282 and the metal oxide film 282 stacked in a laminate form may be formed.

A method of forming the composite film 282 and the metal oxide film 284 that constitute the multi-dielectric film 280, 281 or 282 may be substantially identical to the method described above with reference to FIGS. 2A to 2B and 3A to 3D.

Figure 14:
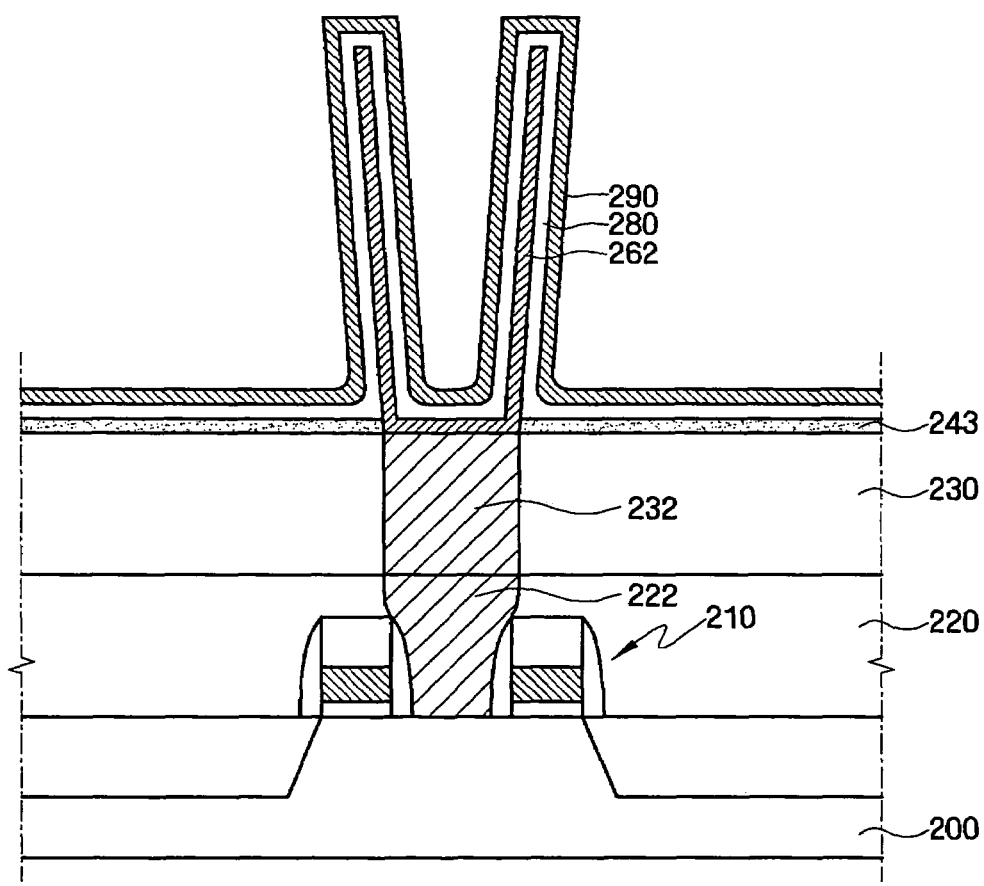

Referring to FIG. 14, an upper electrode 290 of the capacitor is formed on the multi-dielectric film 280, thereby completing the capacitor of the semiconductor device. Like the lower electrode 262, the upper electrode 260 may be formed of TiN, TiAlN, TaN, W, WN, Ru, $RuO_2$, $SrRuO_3$, Ir, $IrO_2$ and/or Pt.

Figure 15:
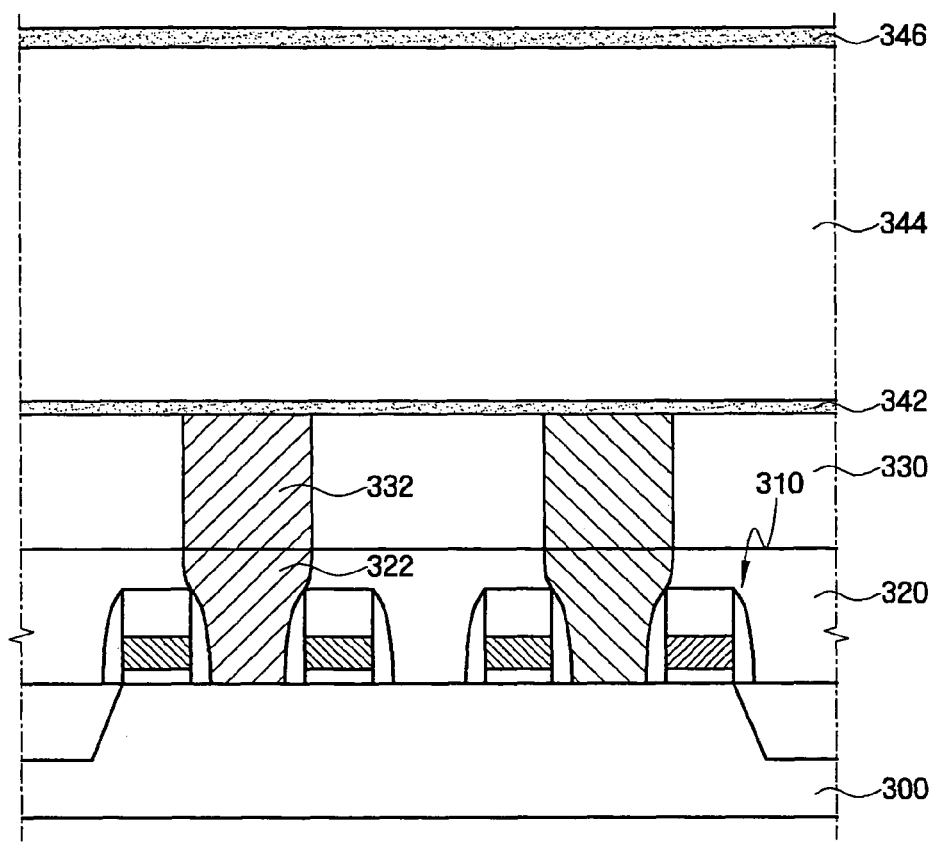
FIGS. 15 through 22 are cross-sectional views sequentially illustrating another method of fabricating a semiconductor device using a multi-dielectric film according to further embodiments of the present invention.

The semiconductor device may also be formed using a method illustrated in FIGS. 15 through 22. Referring to FIG. 15, gate electrodes 310 are formed on a semiconductor substrate 300, and first and second contact plugs 322 and 332, which are connected to an active region of the semiconductor substrate 300, are formed. Then, an etch-stop film 342, an insulating film 344 for a mold, and a lower electrode supporting film 346 are sequentially formed on top surfaces of a second inter-layer insulating film 330 and the second contact plugs 332.

A silicon nitride film (SiN) and/or a silicon oxy-nitride film (SiON) may be used as the etch-stop film 342, and a silicon oxide film may be used as the insulating film 344 for a mold. In addition, the lower electrode supporting film 346 may be formed of a material that has an etching selectivity to the insulating film 344.

Figure 16:
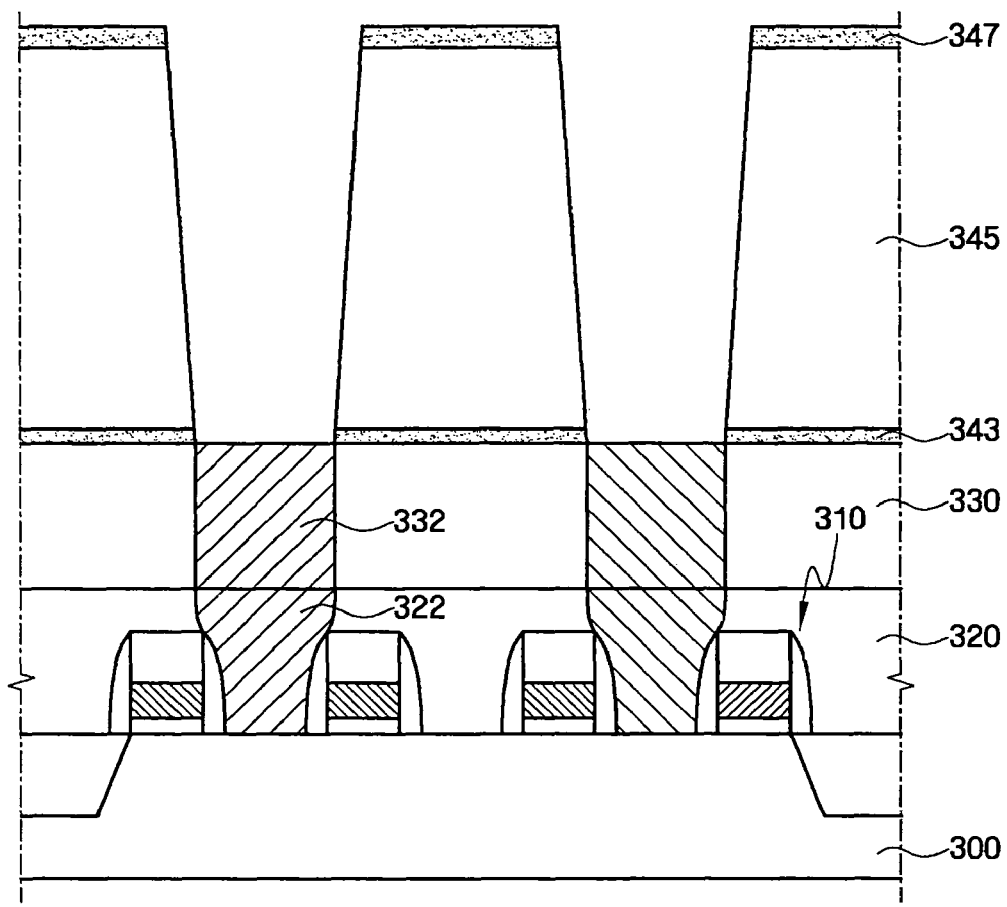

Referring to FIG. 16, a photolithography and etching process are performed to form openings in part of the insulating film 344 and the lower electrode supporting film 346 on the second contact plugs 332 to define a insulating film 345 and a lower electrode supporting film 347, respectively. In this case, the second inter-layer insulating film 330 is not exposed and is protected by the etch-stop film 342. The etching process is continuously performed until portions of the etch-stop film 342 exposed by the openings are removed. Accordingly, holes for forming a lower electrode are formed. The holes expose the second contact plugs 332.

Figure 17:
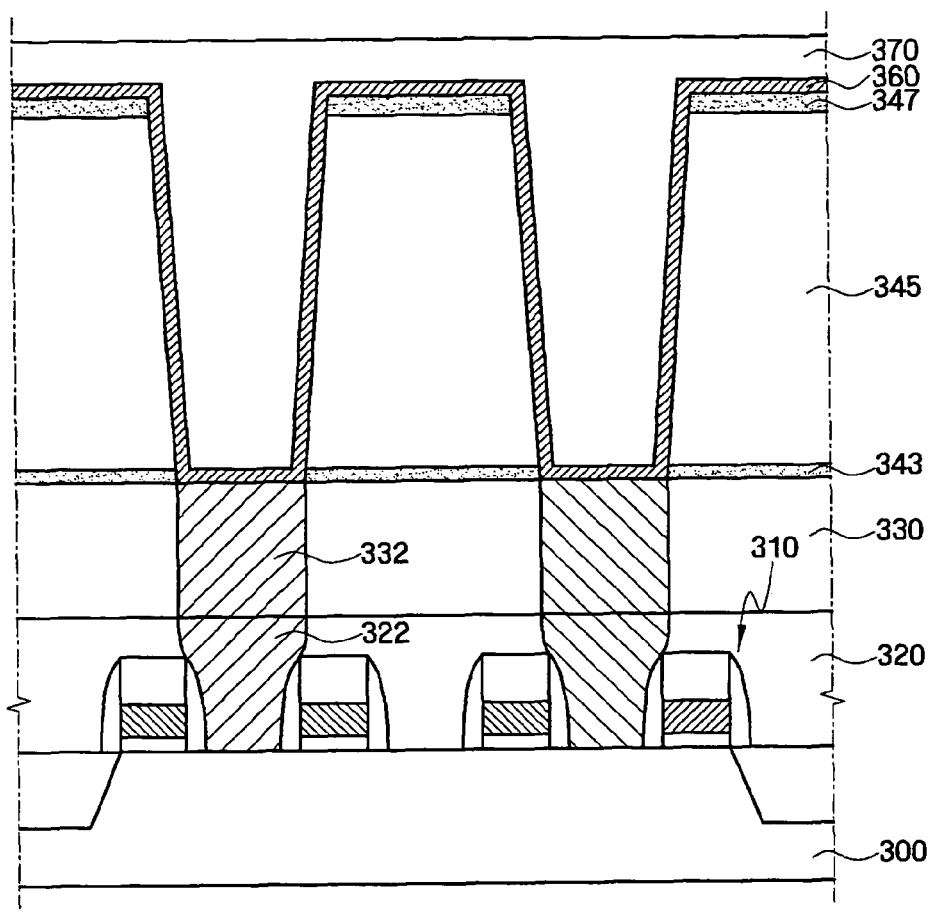

Referring to FIG. 17, a conductive film 360 for a lower electrode is shown conformally formed along surfaces of the holes 352. The conductive film 360 for a lower electrode may be formed of TiN, TiAlN, TaN, W, WN, Ru, $RuO_2$, $SrRuO_3$, Ir, $IrO_2$ and/or Pt.

A sacrificial film 370 is formed, which fills the holes 352 having the conductive film 360 formed on the surfaces thereof. The sacrificial film 370 is formed in order to perform a planarization process for separating a lower electrode. The sacrificial film 370 may be formed of a material that has superior gap-fill characteristics and that can be selectively removed due to its higher etching selectivity than a silicon oxide film or a silicon nitride film.

Figure 18:
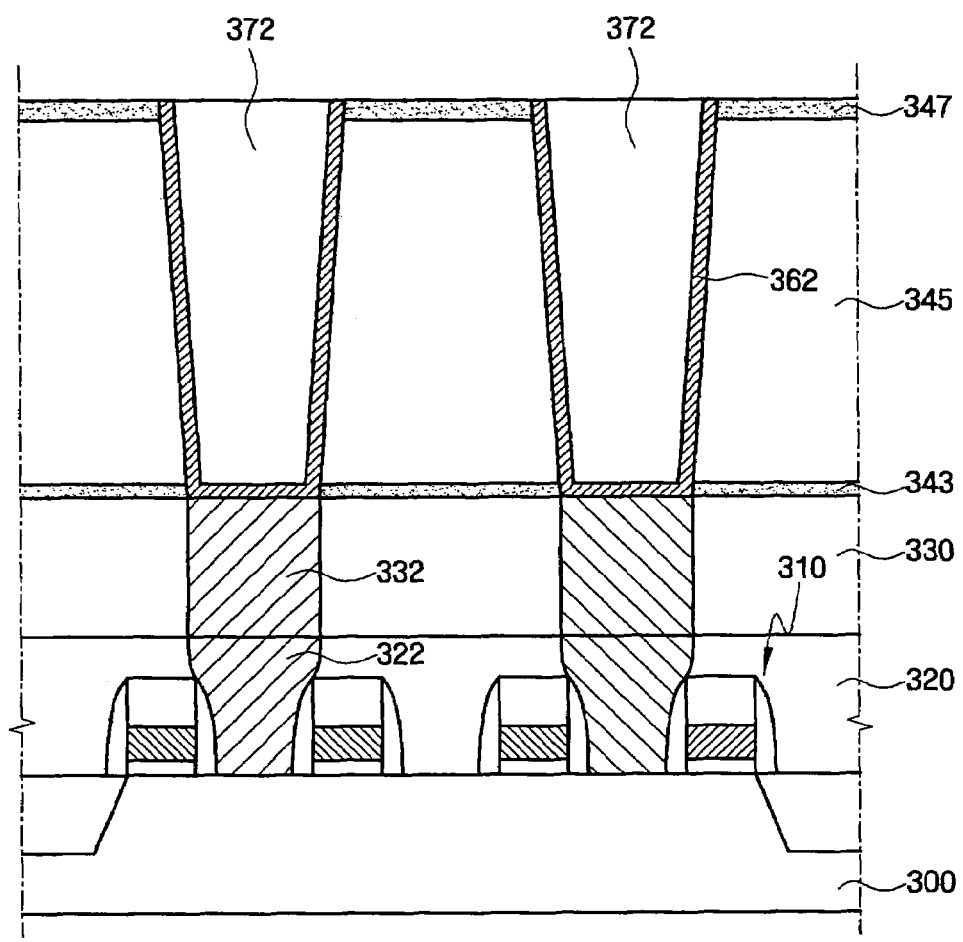

The sacrificial film 370 and the conductive film 360 are removed until the lower electrode supporting film 347 is exposed. A chemical-mechanical polishing process or etch-back process may be used for this operation. Referring to FIG. 18, the conductive film 360 for a lower electrode is separated, and lower electrodes 362 are formed as a result. The sacrificial film 372 remains on and within the lower electrodes 362.

Figure 19:
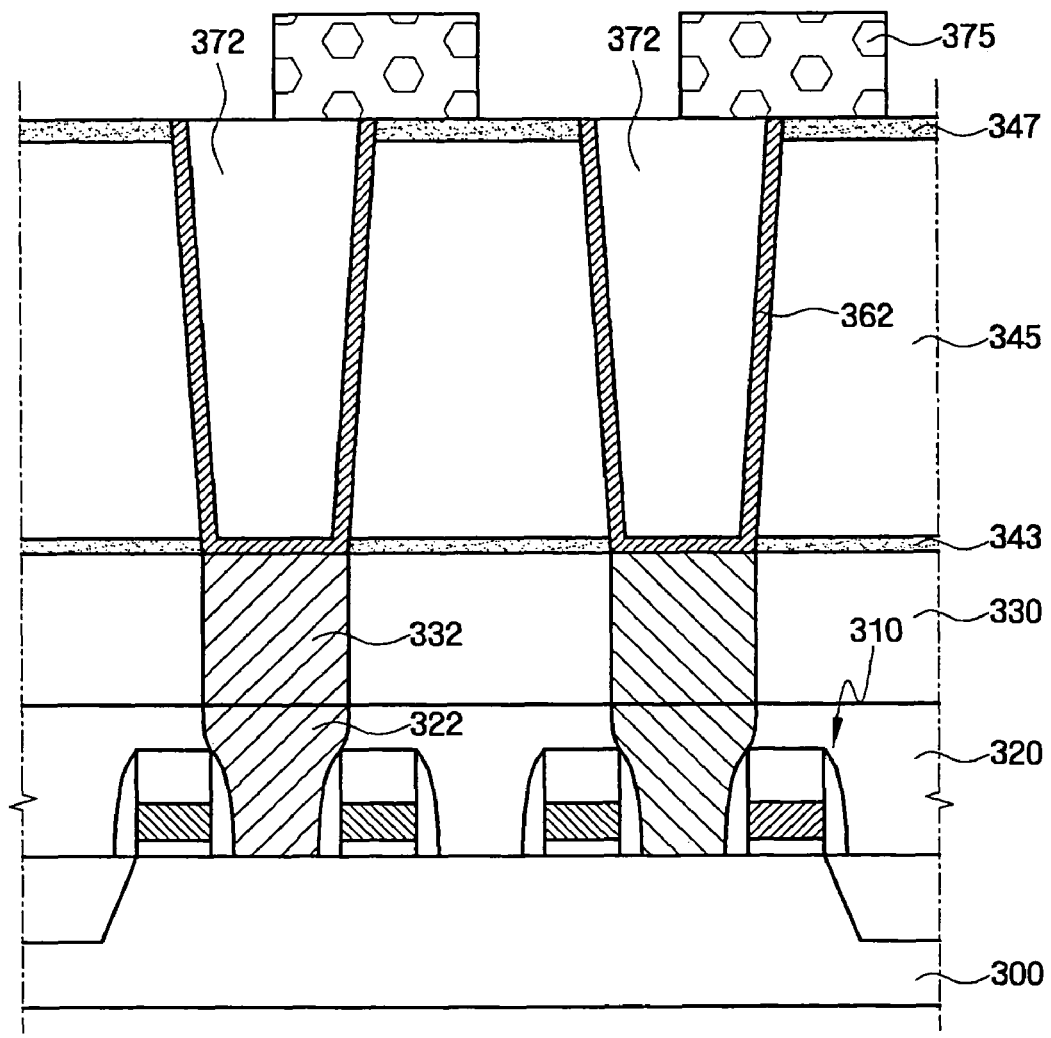
Figure 20:
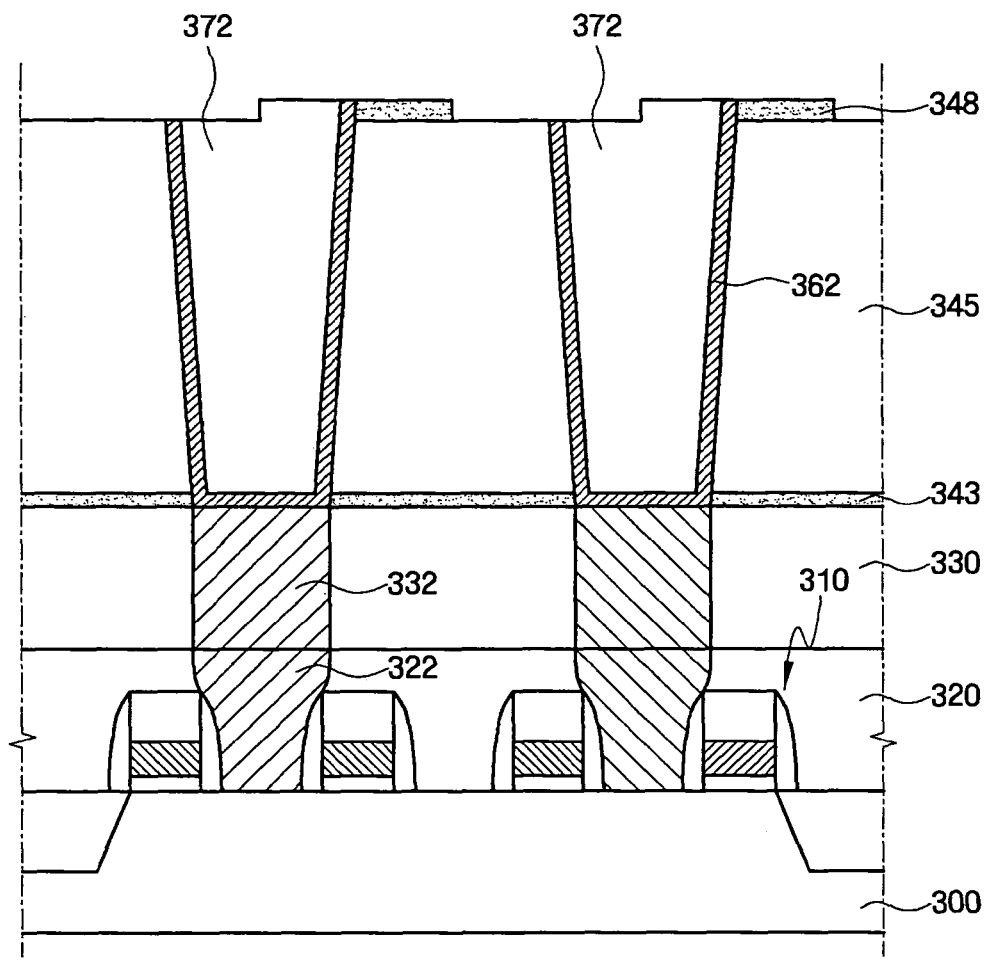

Referring to FIG. 19, a mask pattern 375 for patterning the lower electrode supporting film 347 is formed on the planarized lower electrode supporting film 347 and the sacrificial film 372. The illustrated mask pattern 375 is formed to cover part of each of the lower electrodes 362 and cover the lower electrode supporting film 347 at an end of each of the lower electrodes 362.

The lower electrode supporting film 347, which surrounds an outer side of each of the lower electrodes 362, is etched using the mask pattern 375. Accordingly, referring to FIG. 20, a lower electrode supporting film pattern 348 is formed, which is connected to an end of each of the lower electrodes 362. The lower electrode supporting pattern 348 is also connected to an end of another lower electrode (not shown). In an etching process for forming the lower electrode supporting film pattern 348, part of the lower electrodes 362 and the sacrificial film 372 exposed by the mask pattern 375 may also be etched.

Figure 21:
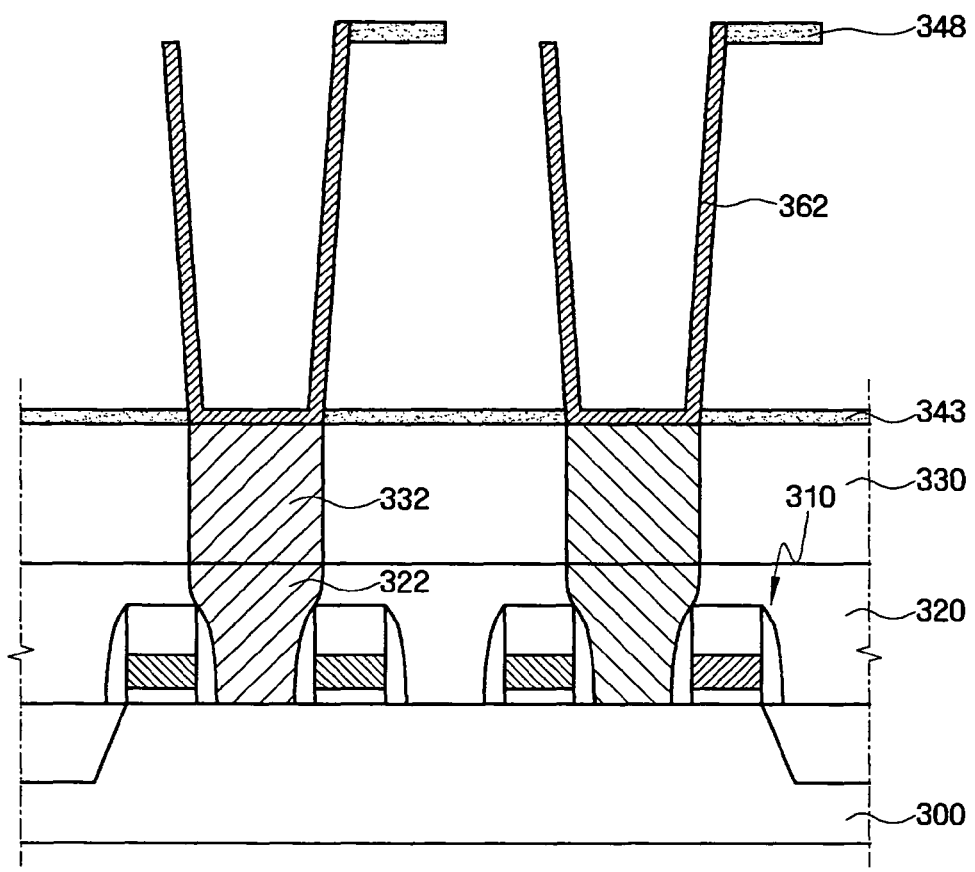

After the mask pattern 375 is removed, a wet-etching process may be performed on the resultant structure as illustrated in FIG. 21. As a result, the sacrificial film 372 and the insulating film 345 for a mold are removed. Accordingly, the cylinder-type lower electrodes 362 are completed. A lower part of each of the lower electrodes 362 is connected to the etch-stop film 343, and an upper part of each of the lower electrodes 362 is connected to the lower electrode supporting film pattern 348. That is, as an end of the upper part of each of the lower electrodes 362 is connected to the lower electrode supporting film pattern 348, the lower electrodes 362 may be limited or even prevented from collapsing, even if the insulating film 345 for a mold and the sacrificial film 372 are removed.

Figure 22:
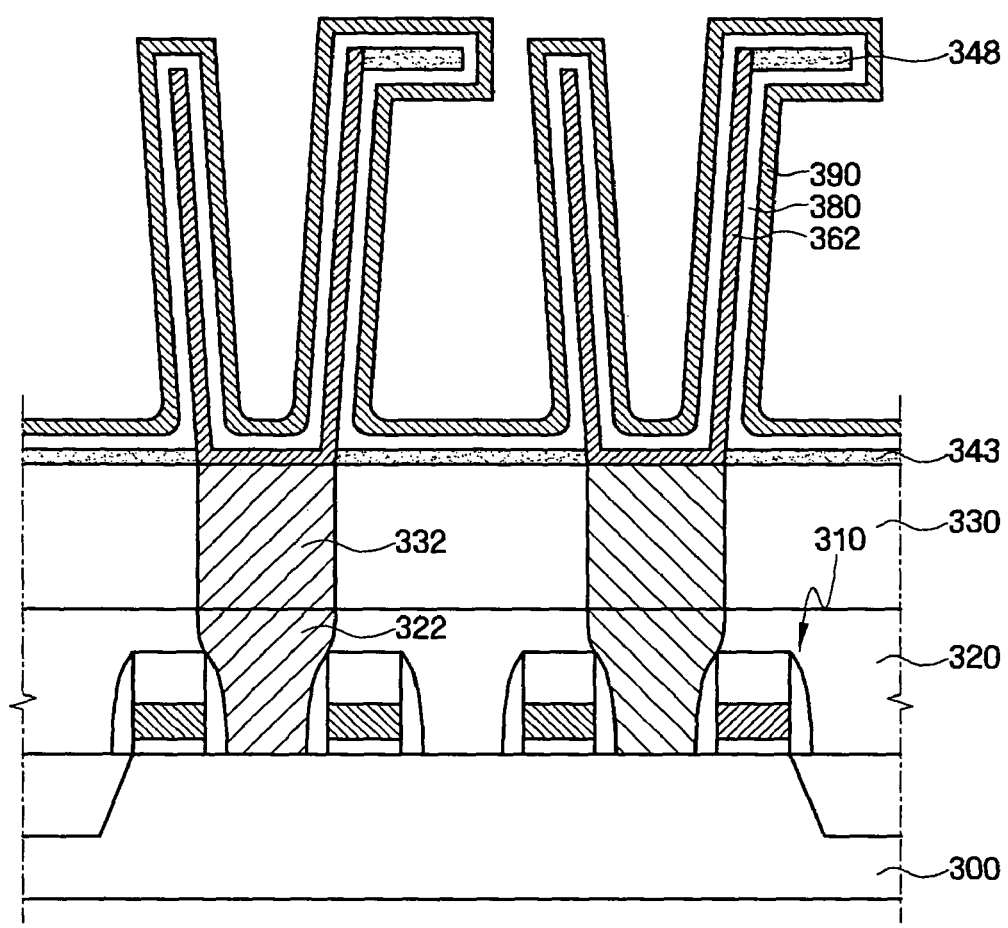

Referring to FIG. 22, a multi-dielectric film 380 is conformally formed along surfaces of the cylinder-type lower electrodes 362, the etch-stop film 343, and the lower electrode supporting film pattern 348. As described above, the multi-dielectric film 380 includes a composite film, which is made of zirconium-hafnium-oxide, and a metal oxide film, which is made of amorphous metal oxide. Upper electrodes 390 are formed on the multi-dielectric film 380, thereby completing a capacitor of the semiconductor device.

As described above, according some embodiments of a method of forming a thin film and a method of fabricating a semiconductor device including the thin film. The thin film includes a composite film, which is made of zirconium-hafnium-oxide, and a metal oxide film, which is made of amorphous metal oxide. Therefore, a multi-dielectric film having a high dielectric constant can be obtained. In addition, as defects of the multi-dielectric film can be reduced, the reliability of the multi-dielectric film may be enhanced.

Furthermore, if the multi-dielectric film is used as a dielectric film of a semiconductor device, the oxidation of a lower electrode can be limited or even prevented when a capacitor of the semiconductor device is formed. Consequently, the leakage current of the semiconductor device can be reduced, and thus reliability thereof may be enhanced.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A multi-dielectric film comprising:
   at least one first dielectric film comprising a composite film made of zirconium-hafnium-oxide; and
   at least one second dielectric film comprising a metal oxide film made of amorphous metal oxide,
   wherein adjacent ones of the dielectric films are made of different materials,
   wherein the metal oxide film comprises amorphous $Al_2O_3$, $La_2O_3$, $LaAlO_3$ and/or $YAlO_3$, wherein the first dielectric film comprises two dielectric films and wherein one of the at least one second dielectric films is positioned between the two first dielectric films.

2. A semiconductor device comprising:
   a semiconductor substrate;
   a lower electrode on the semiconductor substrate;
   a multi-dielectric film on the lower electrode and that includes at least two dielectric films; and
   an upper electrode on the multi-dielectric film,
   wherein each of the at least two dielectric films comprises a composite film made of zirconium-hafnium-oxide or a metal oxide film made of amorphous metal oxide and wherein adjacent ones of the dielectric films are made of different materials,
   wherein the metal oxide film comprises amorphous $Al_2O_3$, $La_2O_3$, $LaAlO_3$ and/or $YAlO_3$.

3. The semiconductor device of claim 2, wherein the lower electrode has a cylinder structure.

4. The semiconductor device of claim 3, further comprising a lower electrode supporting pattern connected to an end of an upper part of the lower electrode.

5. The semiconductor device of claim 2, wherein the at least two dielectric films comprises :
   a first dielectric film comprises of the composite film;
   a second dielectric film on the first dielectric film, the second dielectric film comprising the metal oxide film; and
   a third dielectric film on the second dielectric film, the third dielectric film comprising the composite film.

6. The semiconductor device of claim 2, wherein the lower electrode directly contacts one of the dielectric films comprising the composite film.

7. A method of fabricating a multi-dielectric film, the method comprising:
   forming at least one composite dielectric film comprising a composite film made of zirconium-hafnium-oxide; and
   forming at least one metal oxide dielectric film comprising a metal oxide film made of amorphous metal oxide,
   wherein adjacent ones of the dielectric films are made of different materials,
   wherein the metal oxide film comprises amorphous $Al_2O_3$, $La_2O_3$, $LaAlO_3$ and/or $YAlO_3$.

8. The method of claim 7, wherein forming the at least one composite dielectric film and forming the at least one metal oxide dielectric film comprise:
   forming a first dielectric film comprising the composite film;
   forming a second dielectric film on the first dielectric film, the second dielectric film comprising the metal oxide film; and
   forming a third dielectric film comprising the composite film on the second dielectric film.

9. The method of claim 7, wherein forming the at least one composite dielectric film and forming the at least one metal oxide dielectric film are preceded by forming a lower electrode on a semiconductor substrate and wherein the at least one composite dielectric film and the at least one metal oxide dielectric film are formed on the lower electrode, the method further comprising forming an upper electrode on the multi-dielectric film.

10. The method of claim 9, wherein forming the at least one composite dielectric film and forming the at least one metal oxide dielectric film comprises:
    forming a first dielectric film, which comprises the composite film, on the lower electrode;
    forming a second dielectric film, which comprises the metal oxide film, on the first dielectric film; and
    forming a third dielectric film, which comprises the composite film, on the second dielectric film.

11. The method of claim 9, wherein forming the at least one composite dielectric film and forming the at least one metal oxide dielectric film includes forming one of the composite dielectric films directly on a top surface of the lower electrode.

12. The method of claim 9, wherein the lower electrode has a cylinder structure.

13. The method of claim 9, wherein forming the lower electrode includes forming a lower electrode supporting pattern connected to an end of an upper part of the lower electrode.

14. The method of claim 7, wherein forming at least one composite dielectric film comprises reacting a compound of a zirconium precursor and a hafnium precursor with an oxidizer.

15. The method of claim 7, wherein forming at least one composite dielectric film comprises:
   repeatedly forming zirconium oxide and forming hafnium oxide on the zirconium oxide; and
   heat-treating the formed zirconium oxide and hafnium oxide.

16. The method of claim 9, wherein forming at least one composite dielectric film includes reacting a compound of a zirconium precursor and a hafnium precursor with an oxidizer.

17. The method of claim 9, wherein forming at least one composite dielectric film includes repeatedly forming a zirconium oxide and forming hafnium oxide on the zirconium oxide.

18. The method of claim 17, wherein forming at least one composite dielectric film includes, following repeatedly forming a zirconium oxide and forming hafnium oxide on the zirconium oxide, heat-treating the formed zirconium oxide and the hafnium oxide.

19. The method of claim 9, wherein forming the lower electrode comprises:
   forming an inter-layer insulating film including a contact plug extending therethrough on the semiconductor substrate;
   forming a mold, which exposes a top surface of the contact plug, on the inter-layer insulating film;
   conformally forming the lower electrode on the mold; and
   removing the mold to define the lower electrode.

20. The method of claim 19, wherein the forming the mold comprises:
   stacking an etch-stop film, an insulating film for a mold, and a lower electrode supporting film on the inter-layer insulating film; and
   removing the etch-stop film, the insulating film for the mold, and a portion of the lower electrode supporting film to define the mold which exposes the top surface of the contact plug.

21. The method of claim 19, conformally forming the lower electrode on the mold is followed by forming a lower electrode supporting film pattern connected to an end of the lower electrode by patterning the lower electrode supporting film.

* * * * *